United States Patent
La Rosa et al.

(10) Patent No.: US 10,796,763 B2
(45) Date of Patent: Oct. 6, 2020

(54) METHOD FOR PROGRAMMING A SPLIT-GATE MEMORY CELL AND CORRESPONDING MEMORY DEVICE

(71) Applicants: STMicroelectronics (Rousset) SAS, Rousset (FR); STMicroelectronics (Crolles 2) SAS, Crolles (FR)

(72) Inventors: Francesco La Rosa, Rousset (FR); Marc Mantelli, Fuveau (FR); Stephan Niel, Meylan (FR); Arnaud Regnier, Les Tallades (FR)

(73) Assignees: STMicroelectronics (Rousset) SAS, Rousset (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/256,525

(22) Filed: Jan. 24, 2019

(65) Prior Publication Data
US 2019/0237141 A1   Aug. 1, 2019

(30) Foreign Application Priority Data
Jan. 26, 2018 (FR) ..................... 18 50620

(51) Int. Cl.
| G11C 16/04 | (2006.01) |
| G11C 16/14 | (2006.01) |
| G11C 16/08 | (2006.01) |
| G11C 16/32 | (2006.01) |
| G11C 16/30 | (2006.01) |
| G11C 16/10 | (2006.01) |

(52) U.S. Cl.
CPC ...... *G11C 16/0425* (2013.01); *G11C 16/0433* (2013.01); *G11C 16/08* (2013.01); *G11C 16/10* (2013.01); *G11C 16/14* (2013.01); *G11C 16/30* (2013.01); *G11C 16/32* (2013.01)

(58) Field of Classification Search
CPC ..... G11C 16/0425; G11C 16/08; G11C 16/32; G11C 16/30; G11C 16/10; G11C 16/0433; G11C 16/14; G11C 16/12; G11C 11/40
See application file for complete search history.

(56) References Cited

U.S. PATENT DOCUMENTS

| 5,706,227 A | 1/1998 | Chang et al. |
| 2009/0086538 A1* | 4/2009 | Jenne ................. G11C 16/0466 365/185.02 |

(Continued)

FOREIGN PATENT DOCUMENTS

| FR | 3012673 A1 | 5/2015 |
| WO | 2016118238 A1 | 7/2016 |

OTHER PUBLICATIONS

INPI Search Report and Written Opinion for FR 1850620 dated Sep. 28, 2018 (9 pages).

*Primary Examiner* — David Lam
(74) *Attorney, Agent, or Firm* — Crowe & Dunlevy

(57) ABSTRACT

A split-gate memory cell includes a state transistor possessing a control gate and a floating gate and a selection transistor possessing a selection gate. The split-gate memory cell is programmed by applying, during a programming duration, a first voltage to the control gate, a second voltage to a drain of the state transistor and a third voltage to the selection gate of the selection transistor. The third voltage is transitioned during the programming duration between a first value and a second value greater than the first value.

18 Claims, 5 Drawing Sheets

(56) References Cited

U.S. PATENT DOCUMENTS

| | | | |
|---|---|---|---|
| 2011/0235427 A1* | 9/2011 | Chen | G11C 16/10 |
| | | | 365/185.19 |
| 2013/0228846 A1 | 9/2013 | La Rosa et al. | |
| 2016/0293256 A1* | 10/2016 | Hsu | G11C 16/06 |
| 2017/0148519 A1 | 5/2017 | Jin | |

* cited by examiner

| IprogCTL<br><3:0> | Iprog<br>(µA) |
|---|---|
| 0000 | 0.25 |
| 0001 | 0.5 |
| 0010 | 0.75 |
| 0011 | 1 |
| 0100 | 1.25 |
| 0101 | 1.5 |
| 0110 | 1.75 |
| 0111 | 2 |
| 1000 | 2.25 |
| 1001 | 2.5 |
| 1010 | 2.75 |

METHOD FOR PROGRAMMING A SPLIT-GATE MEMORY CELL AND CORRESPONDING MEMORY DEVICE

PRIORITY CLAIM

This application claims the priority benefit of French Application for Patent No. 1850620, filed on Jan. 26, 2018, the content of which is hereby incorporated by reference in its entirety to the maximum extent allowable by law.

TECHNICAL FIELD

Implementations and embodiments herein relate to memories including "split-gate" memory cells each comprising a selection transistor and a floating gate state transistor, and more particularly relate to the programming thereof.

BACKGROUND

The logic value of a bit stored in a split-gate memory cell is represented by the value of the threshold voltage of the floating gate transistor. When the memory cell is in an "erased" state, the logic value of the bit stored in this memory cell has a first value, e.g. the value "1". Programming an erased memory cell is aimed at changing this cell into a "programmed" or "written" state in which the logic value of the bit stored in this memory cell has a second value, e.g. the value "0".

Split-gate memory cells are conventionally programmed by hot electron injection (or "hot carrier injection"). Hot electron injection programming, compared with tunnel effect programming, offers the advantage of being of short duration, usually 100 times shorter than tunnel effect programming. More precisely, the programming time of a memory cell by hot electron injection is typically of the order of a few microseconds against a few milliseconds for tunnel effect programming.

In hot electron programming, two transistors of the memory cell cooperate for injecting electrical charges into the floating gate. The selection transistor has a conductive channel in which a current is formed including high kinetic energy electrons, called "hot electrons". When this current reaches the conductive channel of the state transistor, an injection area is formed where the high-energy electrons are injected into the floating gate of this transistor under the effect of a vertical electric field created by the voltage applied to the control gate of the state transistor.

To obtain a good injection performance, it is desirable that the selection transistor operates in saturated mode (with the drain-source voltage being much higher than the gate-source voltage) so that its conductive channel has a pinch-off region in the vicinity of the injection region. The concentration of the current in the pinch-off region favors the emergence of high kinetic energy electrons, with the result being that the injection performance is high. This saturated operating mode of the selection transistor is also known as "weak-inversion" or "subthreshold" operation (operating mode below the threshold voltage).

The saturated operating mode of the selection transistor is conventionally obtained by imposing a weak programming current in the memory cell, by a current source, while the source-gate voltage of this selection transistor adjusts automatically to the imposed current, by cascode effect.

To program a memory cell, the following are typically applied for a programming duration (programming pulse):

a high voltage to the control gate of the state transistor, typically a voltage on the order of 10 volts, a voltage on the order of 1 volt to the gate of the selection transistor, and a voltage on the order of 4 to 5 volts to the drain of the state transistor.

Typically, the duration of the programming pulse is of the order of 4 microseconds.

However, a current peak appears on the drain of the state transistor at the start of the programming pulse. This current peak results in the generation of hot electrons and this current peak then diminishes throughout the programming.

The different voltages applied to the memory cell being programmed, and notably the voltage applied to the bitline connected to the drain of the state transistor, are supplied by a charge pump circuit.

However, when many cells are programmed simultaneously, e.g. 64 memory cells, the various current peaks appearing on the corresponding bitlines force the charge pump circuit to be over-dimensioned.

One approach for attenuating the current peak appearing at the start of the programming pulse on the drain of the memory cell involves lowering the value of the voltage applied to the gate of the selection transistor of the memory cell.

However, such a solution is not satisfactory because a drop in the voltage applied to the gate of the selection transistor leads to a drop in programming efficiency, i.e. a drop in the quantity of hot carriers injected into the floating gate, that could lead to an insufficient threshold voltage of the floating gate transistor in the programmed state.

There is therefore a need to be able to efficiently program a memory cell of the split-gate type while limiting, or even eliminating, the current peak appearing at the start of programming in the prior art.

SUMMARY

In this regard, according to one aspect, a method is provided for programming a split-gate memory cell, the split-gate memory cell comprising a state transistor possessing a control gate and a floating gate, and a selection transistor.

The method according to this aspect includes an application, during a programming duration, of a first voltage to the control gate, a second voltage to the drain of the state transistor, and a third voltage to the gate of the selection transistor, this third voltage transitioning during said programming duration between a first value and a second value greater than the first value.

In other words, contrary to what takes place in the prior art, a constant voltage is not applied during the programming duration (application of the programming pulse) to the gate of the selection transistor but a variable voltage is applied to this gate of the selection transistor, the value of the third voltage at the end of the programming pulse being greater than the value of the voltage at the start of the programming pulse.

This variable voltage is applied exclusively on the gate of the selection transistor, i.e only on the gate of the selection transistor but not on the control gate.

The extent of the variable voltage applied on the gate of the selection transistor is advantageously limited aiming to modulate the programming current with no effect on the vertical electric field which is controlled by the control gate only.

In other words this variable voltage has no effect on the vertical electric field of the storage element but only in the current flowing in the memory cell during the programming phase.

In practice, the first value and the second value are advantageously situated in the vicinity of the threshold voltage of the selection transistor. This permits to obtain the limited extent of the variable voltage aiming to modulate the programming current with no effect on the vertical electric field as explained above.

Furthermore, according to one implementation, the first value and the second value are preferably chosen so that at the end of the programming duration, the threshold voltage of the state transistor of the memory cell in the programmed state is at a chosen value, allowing a differentiation between this programmed state and an erased state of the memory cell, when a read voltage is applied to the control gate of the state transistor.

Thus, it is desirable for a state transistor in the programmed state to obtain a threshold voltage that is situated on one side of the threshold voltage of the state transistor of a cell in the virgin state, while the threshold voltage of the state transistor in the erased state is situated on the other side of the threshold voltage of the state transistor of the cell in the virgin state.

Thus a programmed cell may easily be differentiated from an erased cell, when applying a read voltage to the memory cell, this read voltage having a value situated between the two threshold voltages in the erased state and in the programmed state of the state transistor.

Although not essential, a depletion state transistor may advantageously be used, making it possible to apply a zero read voltage to the control gate thus avoiding read stress being induced which makes it possible to significantly reduce, or even eliminate, the risk of the appearance of disturbances during reading.

Such a distribution phenomenon may express itself in a modification of the logic value of the stored bit.

According to one implementation, the third voltage advantageously transitions substantially along a ramp between the first and the second value.

The word "ramp" should be taken here in a very broad sense to notably encompass any increasing evolution of the third voltage between the first value and the second value, this increasing evolution not necessarily being linear but possibly being exponential, for example.

However, it is particularly simple to provide for the third voltage to transition along a substantially linear ramp. Such a substantially linear evolution may be a continuous evolution or an incremental one when, for example, a digital-to-analog conversion is provided for generating this ramp.

Although this is not essential, it is particularly advantageous to generate the third voltage from an injection, during the programming duration, of a variable programming reference current, in a control memory cell, and to sample the third voltage on a terminal of the control memory cell.

Such an implementation makes it possible to adjust for variations in temperature and manufacturing method in generating the programming current.

According to another aspect, a memory device is provided, including: a split-gate memory cell, the memory cell including a state transistor possessing a control gate and a floating gate and a selection transistor, and programming circuitry configured for applying, during a programming duration, a first voltage to the control gate, a second voltage to the drain of the state transistor, and a third voltage to the gate of the selection transistor, the third voltage transitioning during said programming duration between a first value and a second value greater than the first value.

According to one embodiment, the first value and the second value are situated in the vicinity of the threshold voltage of the selection transistor.

According to one embodiment, the programming circuitry is configured for applying the first value and the second value such that at the end of the programming duration, the threshold voltage of the state transistor of the memory cell in the programmed state is at a chosen value, allowing a differentiation between this programmed state and an erased state of the memory cell when a read voltage is applied to the control gate of the state transistor.

According to one embodiment, the programming circuity is configured for generating the third voltage so that it transitions substantially along a ramp between the first value and the second value.

According to one embodiment, the programming circuitry is configured for generating the third voltage so that it transitions along a substantially linear ramp.

According to one embodiment, the programming circuitry includes a control memory cell, controllable current generation circuitry, and control circuitry configured for controlling the current generation circuitry so as to inject a variable programming reference current into the control memory cell during the programming duration, the third voltage being sampled on a terminal of the control memory cell.

According to one embodiment, the control memory cell is structurally identical to the memory cell, and the programming circuitry includes control circuitry configured for maintaining the state transistor of the control memory cell in a conductive state so as to electrically connect the gate of the selection transistor of the control memory cell to the drain of the state transistor of the control memory cell, the output of the controllable current generation circuitry being connected to said drain, the third voltage being sampled at said drain.

According to one embodiment, the selection transistor of the memory cell is a buried vertical gate transistor, and both the control gate and the floating gate of the state transistor of the memory cell are horizontal.

According to one embodiment, the device includes: a memory plane including a matrix of memory cells arranged in rows and columns, wordlines respectively coupled to the gates of the selection transistors of the memory cells of the same row, bitlines coupled to the drains of the state transistors of the memory cells of the same column, and the programming circuitry is configured for delivering the third voltage to the wordline coupled to the selection transistors of the memory cells having to be programmed.

In one such embodiment, the programming circuitry advantageously includes one control memory cell per row of memory cells of the memory plane.

The memory device may be, for example, made in integrated form.

BRIEF DESCRIPTION OF THE DRAWINGS

Other advantages and features will appear on examination of the detailed description of implementations and embodiments, which are in no way restrictive, and the appended drawings in which.

DETAILED DESCRIPTION

Figure 1:
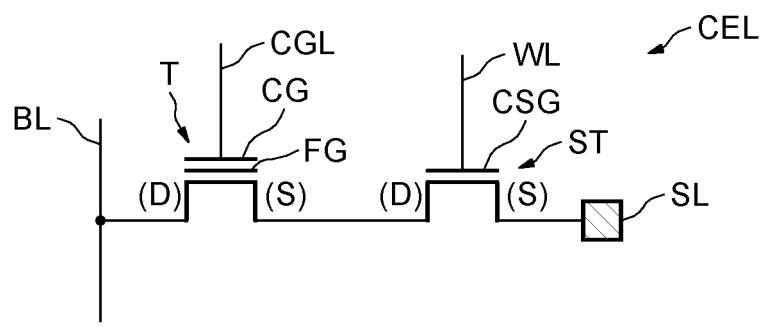
FIG. 1 is a schematic diagram of a split-gate memory cell disclosed herein.

In FIG. 1, the reference CEL designates a split-gate non-volatile memory cell, e.g. a selection transistor having a vertical gate buried in the substrate of an integrated circuit.

More precisely, the memory cell CEL comprises a state transistor T having a floating gate FG surmounted by a control gate CG connected to a gate control line CGL.

The drain D of the state transistor T is connected to a bitline BL while the source of the state transistor T is connected to the drain of a selection transistor ST.

The selection transistor ST comprises a gate CSG connected to a wordline WL.

The source S of the selection transistor ST is connected to a source line SL.

The state transistor may be of the "accumulation" type or of the "depletion" type, comprising, for example, an implanted channel, as described in the French Patent Application published as U.S. Pat. No. 3,049,380 (incorporated by reference).

The devices disclosed herein may be used with any type of memory plane architecture.

Figure 2:
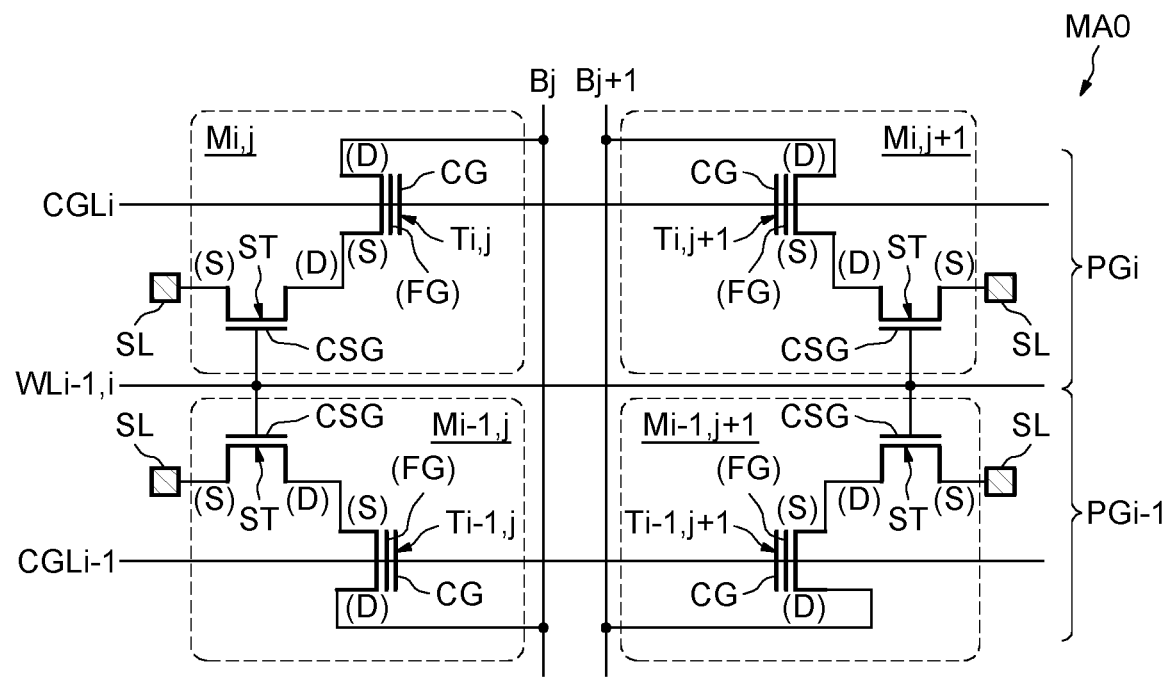
FIG. 2 is a schematic diagram of a memory plane including the split-gate memory cells of FIG. 1.

By way of example, FIG. 2 represents a memory plane structure MAO of a memory device including memory cells Mi,j, Mi,j+1, Mi-1,j, Mi-1,j+1 of the type described in United States Patent Publication No. 2013/0228846 (incorporated by reference). The memory cells Mi,j, Mi,j+1 of rank "i" belong to a physical page PGi of the memory plane and are connected to a wordline WLi-1,i and to a gate control line CGLi. The memory cells Mi-1,j, Mi-1,j+1 of rank "i-1" belong to a physical page PGi-1 of rank "i-1" of the memory plane and are connected to the wordline WLi-1,i and to a gate control line CGLi-1. The memory cells Mi,j, Mi-1,j of rank "j" are accessible in reading and writing via a bitline Bj and the memory cells Mi,j+1, Mi-1,j+1 of rank "j-1" are accessible in reading and writing via a bitline Bj+1.

Each memory cell comprises a floating gate transistor (FG), respectively Ti,j, Ti,j+1, Ti-1,j, Ti-1,j+1. The drain (D) regions of the transistors Ti,j, Ti-1,j are connected to the bitline Bj and the drain terminals of the transistors Ti,j+1, Ti-1,j+1 are connected to the bitline Bj+1. The control gates CG of the transistors Ti,j, Ti,j+1 are connected to the gate control line CGLi and the control gates CG of the floating gate transistors Ti-1,j, Ti-1,j+1 are connected to the gate control line CGLi-1.

Each floating gate transistor has its source (S) terminal connected to a source line SL via a selection transistor ST. The selection transistors ST of the memory cells Mi,j and Mi-1,j have a common selection gate CSG and the two memory cells are accordingly termed "twins". Similarly, memory cells Mi,j+1 and Mi-1,j+1 are twin memory cells and their selection transistors ST have a common selection gate CSG. Each selection gate CSG is a vertical gate buried in a substrate in which the memory plane MAO is implemented, and the source line SL is also buried. These common selection gates CSG of twin memory cells, are connected to the wordline WLi-1,i.

Figure 3:
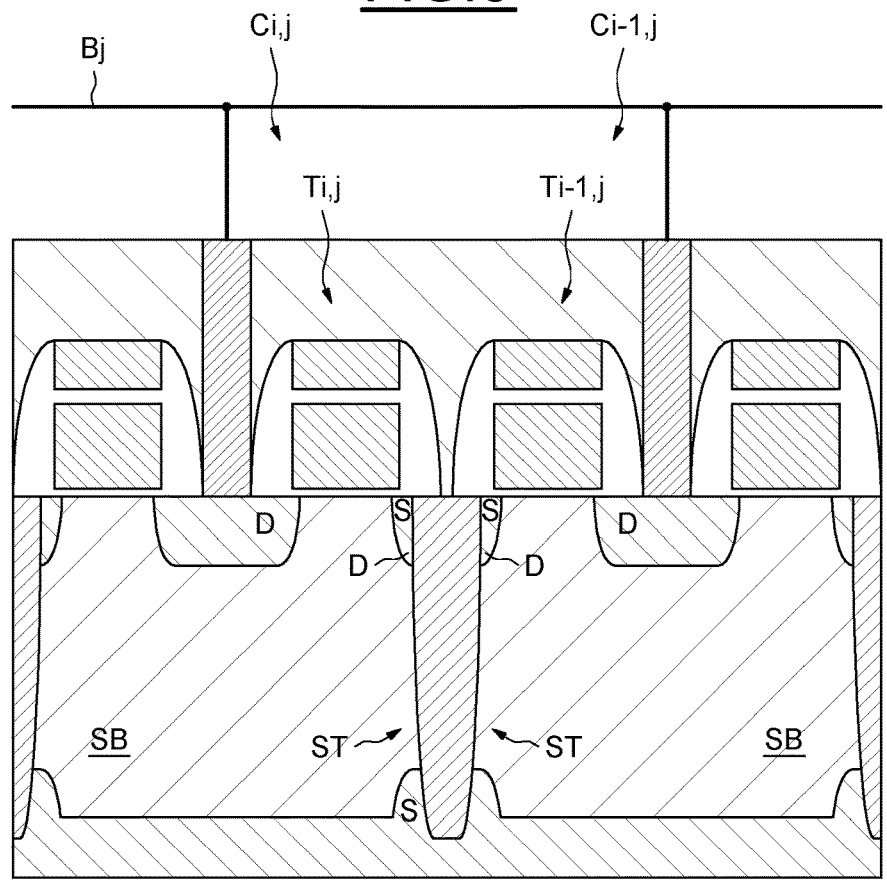
FIG. 3 is a cross section of the split-gate memory cells of FIG. 2.

As illustrated in FIG. 3, each state transistor of the memory device in FIG. 2 cooperates with a vertical selection transistor buried in the substrate SB. The selection transistors ST connected to the two state transistors Ti,j and Ti-1,j each have a vertical channel and a buried vertical common selection gate. It should be noted that for purposes of simplification of the Figure, the contact for connecting the buried common gate CSG to the corresponding wordline is not represented.

This memory plane structure including twin memory cells utilizes a wordline decoder capable of applying a read voltage to a memory cell to be read, while applying a read-inhibit voltage to its twin memory cell.

In order to avoid the application of such read-inhibit voltages, a structure may be used that includes a memory plane and "double bitline" twin memory cells, e.g. as described in the French Patent Application No. 3036221 (incorporated by reference).

As explained above and illustrated in FIG. 4, the programming of a split-gate memory cell according to the prior art, exhibits, at the start of the programming pulse, a current peak on the drain of the state transistor of the memory cell.

Figure 4:
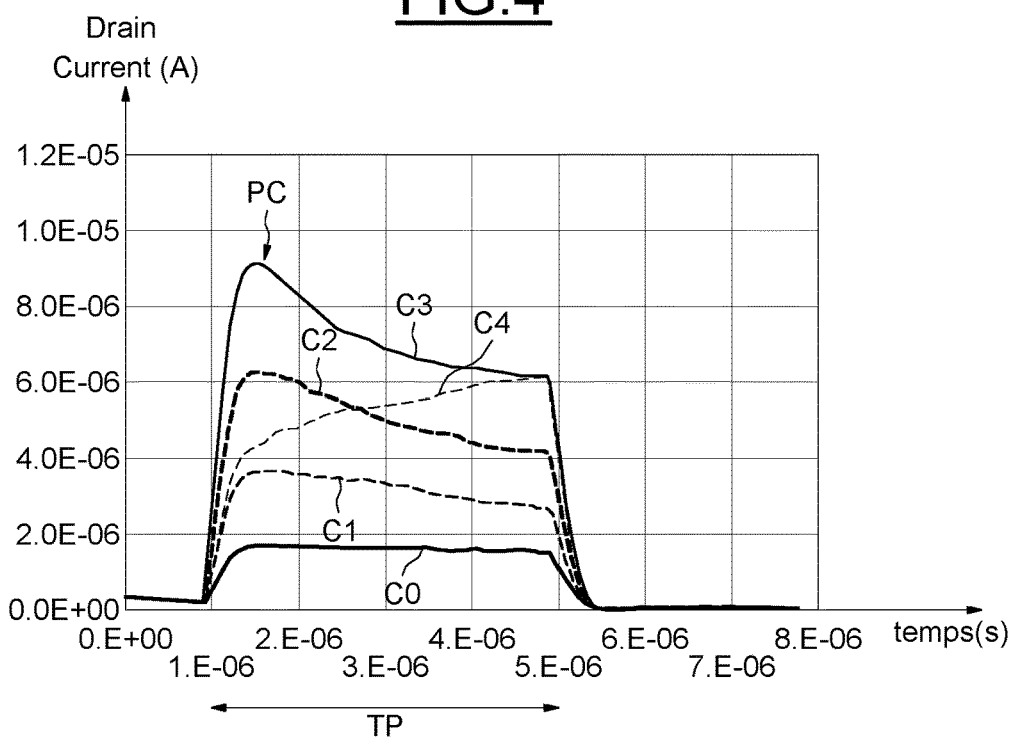
FIG. 4 is a graph showing programming of prior art split-gate memory cells.

This is illustrated in particular by the curve C3 in FIG. 4, which shows a drain current peak PC on the order of 9 microamperes at the start of the programming pulse of duration TP (here 4 μs). This peak is progressively attenuated throughout the programming duration TP.

The peak PC is obtained here for a voltage of 1.2 volts applied to the gate of the selection transistor.

As the curves C0, C1 and C2 demonstrate, it is possible to attenuate or even to eliminate this current peak by reducing the value of the voltage applied to the gate of the selection transistor. More precisely, for the curve C2, the value of the voltage applied to the gate of the selection transistor during the programming duration is equal to 1.1 volts while it is equal to 1 volt for the curve C1 and 0.9 volts for the curve C0.

However, this approach is not satisfactory because it leads to lesser programming efficiency.

In order to eliminate this current peak while not penalizing the programming efficiency, provision is made to cause the voltage applied to the transistor selection gate to transition in the course of the programming duration, as will now be described, with reference to FIG. 5 and the following Figures.

Figure 5:
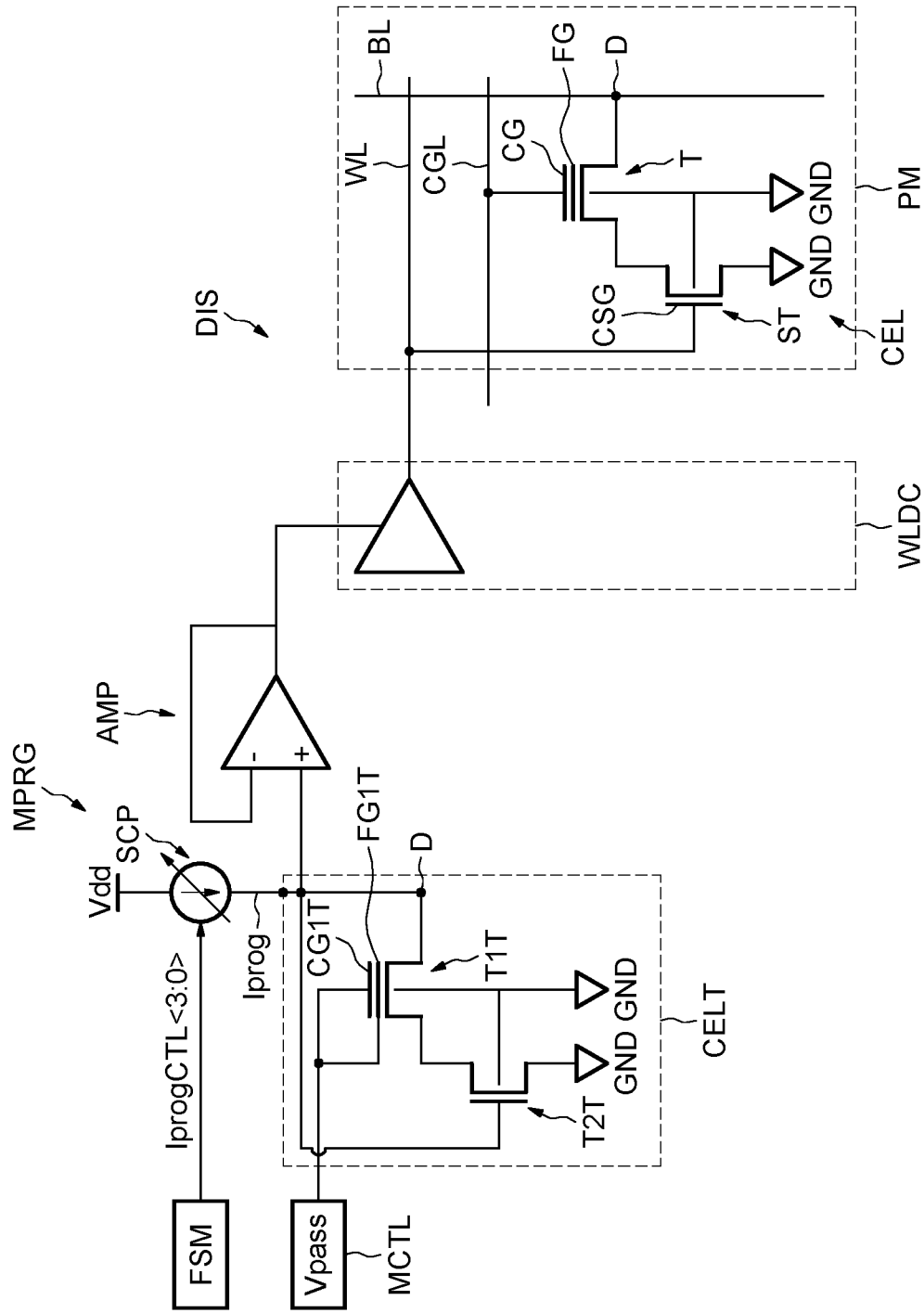
FIG. 5 is a schematic diagram of programming circuitry for the split-gate memory cells, such as that of FIG. 1.

In FIG. 5, the reference CEL designates a split-gate memory cell comprising a floating gate FG state transistor T also possessing a control gate CG connected to a gate control line CGL. The drain D of the state transistor is connected to the bitline BL.

The memory cell CEL also comprises a selection transistor ST, the gate CSG of which is connected to a wordline WL and the source of which is connected to the ground.

The drain of the selection transistor is connected to the source of the state transistor.

In this example, the memory plane PM of the memory device DIS intentionally includes a single memory cell CEL, for simplification purposes, but it should be recognized that the memory plane PM may have any number of such memory cells CEL.

The memory plane PM generally includes a matrix of memory cells CEL.

However, only a single memory cell CEL is described here, the programming principle taught herein being able to be applied individually to one cell.

The memory device DIS, advantageously implemented in an integrated manner within an integrated circuit, also comprises programming circuitry MPRG configured for applying, during a programming duration TP, a first voltage to the control gate CG of the state transistor T, a second voltage to the drain D of the state transistor T, and a third voltage to the gate CSG of the selection transistor.

As will be seen in more detail below, this third voltage transitions during the programming duration TP between a first value and a second value that is greater than the first value. In particular, it will be noted that this variable voltage is applied exclusively on the gate of the selection transistor, i.e., only on the gate of the selection transistor but not on the control gate. The variation in the third voltage applied on the gate of the selection transistor is advantageously limited aiming to modulate the programming current with no effect on the vertical electric field which is controlled by the control gate only. In other words, the variation in the third voltage has no effect on the vertical electric field of the storage element but only in the current flowing in the memory cell during the programming phase.

While it would be possible to generate the third voltage on the gate of the selection transistor, by any conventional circuitries known to the person skilled in the art, it is particularly advantageous to use a control cell CELT such as that described in FIG. 5.

Indeed, in combination with this control cell CELT, the programming circuitry MPRG comprises controllable current generation circuitry SCP and control circuitry FSM (e.g. a state machine) configured for controlling the current generation circuitry SCP so as to inject a variable programming reference current into the control memory cell CELT during the programming duration TP. The third voltage is delivered to the gate of the selection transistor, then is sampled on a terminal of the control memory cell.

Such an embodiment advantageously makes it possible notably to dispense with variations in manufacturing method and variations in temperature since the programming current that will be injected into the memory cell CEL by applying the third voltage to the gate of the selection transistor, will then be very close to the programming reference current injected into the control memory cell CELT.

The control memory cell CELT is structurally identical to the memory cell.

More precisely, it also comprises a state transistor T1T having a floating gate FG1T and a control gate GC1T, as well as a selection transistor T2T, here a vertical gate selection transistor.

The source of the selection transistor T2T is connected to the ground while its drain is connected to the source of the state transistor T1T.

The drain D of the state transistor T1T is connected to the output of the current generation circuitry SCP.

However, the gate of the selection transistor T2T is connected to the drain of the state transistor T1T, and therefore also to the output of the current generation circuitry SCP.

Control circuitry MCTL is also provided, here a voltage source generating a voltage Vpass on the control gate CG1T and on the floating gate FG1T of the state transistor. The voltage Vpass is chosen so as to maintain the state transistor T1T in a conductive state.

Accordingly, the drain of the selection transistor T2T is in practice connected to the gate of this transistor T2T, the selection transistor T2T being accordingly diode mounted.

By virtue of this arrangement, the voltage present at the drain D of the state transistor T1T of the control memory cell, and resulting from the injection of a programming reference current Iprog in the control cell, is thus sampled and transmitted via a follower amplifier AMP to the driver circuit of a row decoder WLDC to be then delivered, as a third voltage, to the gate CSG of the selection transistor ST of the memory cell CEL to be programmed.

Figures 6, 7:
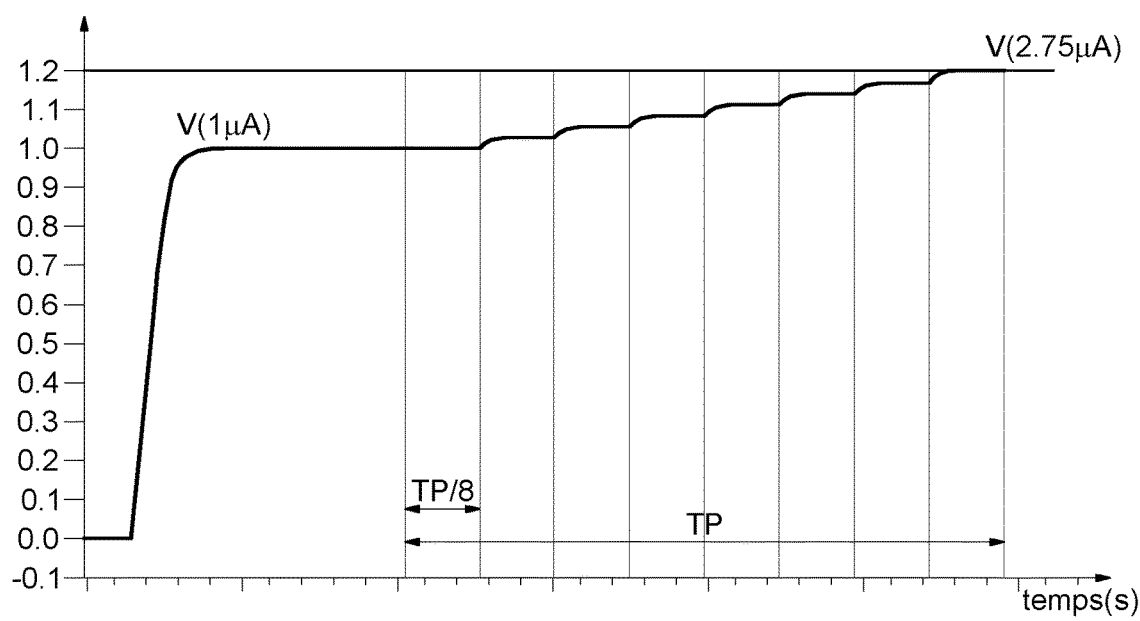
FIG. 6 is a chart of programming reference currents such as may be used with the programming circuitry of FIG. 5.
FIG. 7 is a graph of programming current vs. word line voltage for the programming circuitry of FIG. 5.

As illustrated in FIG. 6, the control circuitry FSM will control the generation circuitry SCP so that the latter incrementally delivers the programming reference current Iprog, which varies by steps from the value 0.25 microamperes to the value 2.75 microamperes.

The programming current therefore varies by an increment of 0.250 microamperes according to an increasing evolution by stages, the average value of which follows a linear ramp.

However, as illustrated in FIG. 7, it is expected that the programming current reaches the value of 1 microampere, corresponding to a voltage of 1 volt on the drain of the state transistor of the control memory cell T1T before triggering the programming pulse that has the duration TP.

Accordingly, the voltage V on the drain of the state transistor of the control memory cell CELT, which corresponds to the third voltage delivered to the gate of the selection transistor ST of the memory cell CEL to be programmed, will increase incrementally between this first voltage value equal to 1 volt and a second voltage value equal to 1.2 volts (corresponding to the programming reference current equal to 2.75 microamperes).

This second voltage value (1.2 volts) is therefore reached at the end of eight increments of duration TP/8.

Therefore, the third voltage delivered to the gate of the selection transistor ST of the memory cell CEL varies substantially linearly in increasing fashion between a first value equal to 1 volt and a second value equal to 1.2 volts, in 4 microseconds.

As illustrated in FIG. 6, the current generation circuitry is controlled by a digital control word IprogCTL, here in 4 bits, the word 0011 corresponding to the value of 1 microampere while the word 1010 corresponds to the value of 2.75 microamperes.

Figure 8:
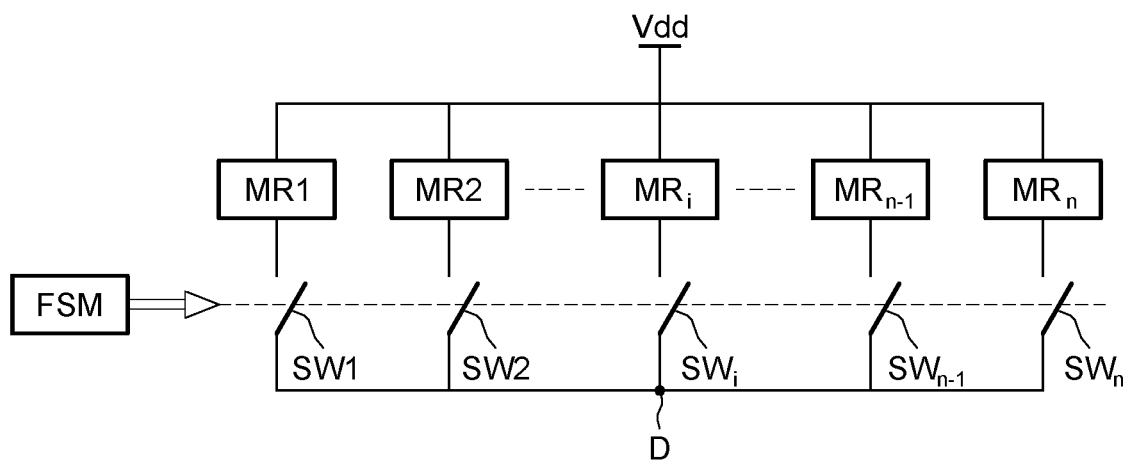
FIG. 8 is a schematic block diagram showing current sources within a memory device incorporating split-gate memory cells such as those of FIG. 1.

As illustrated in FIG. 8, the current source includes, for example, controllable individual current sources MRi, e.g. a PMOS transistor associated with a current mirror, each capable of generating an elementary current of 0.250 microamperes. The digital words IprogCTL make it possible to close or not to close the switches SW1-SWn making it possible to connect or not to connect an elementary current source MRi to the drain of the state transistor T1T of the control memory cell CELT.

Returning now to FIG. 4, it is seen, on the curve C4, that the fact of having caused the voltage to transition on the gate of the selection transistor ST of the memory cell CEL to be programmed, between a first value and a second value greater than the first value, during the programming duration TP, here 4 microseconds, has made it possible to eliminate the current peak PC that was present on the curve C3 which corresponded to applying a constant voltage of 1.2 volts.

Furthermore, at the end of programming, the threshold voltage of the state transistor T of the programmed memory cell CEL, reaches with a voltage ramp varying from 1 volt to 1.2 volts, a value of the order of 3.8 volts which substantially corresponds to the value of the threshold voltage that had been obtained with the curve C3.

Accordingly, it can be clearly seen here that the disclosures herein have made it possible to dispense with the current peak PC on the drain current of the state transistor of the memory cell CEL, at the start of the programming pulse, while maintaining the same programming efficiency.

Of course, the application here of a voltage ramp varying from 1 volt to 1.2 volts is only an example. Other voltage values could be chosen for the start and the end of the ramp.

The person skilled in the art will know how to choose these values taking into account the chosen programming duration and the physical features of the memory cell CEL for obtaining a chosen programming efficiency with a threshold voltage suitable for the state transistor in the programmed state.

Similarly, it would also be possible to use as the architecture of the control memory cell CELT, an architecture of the type described in U.S. Pat. No. 9,224,482 (incorporated by reference).

Figure 9:
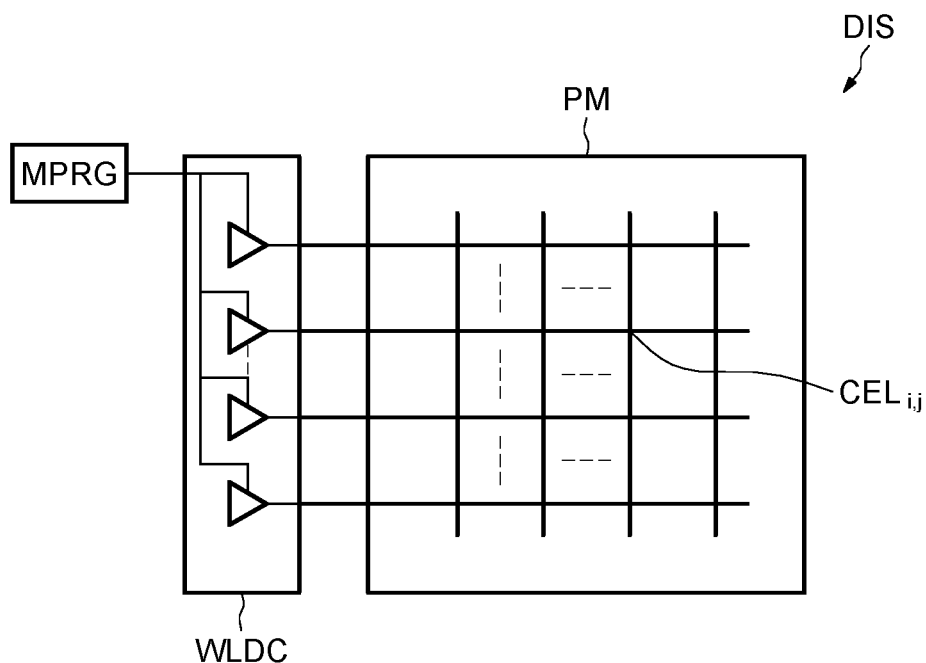
FIG. 9 is a block diagram showing a memory plane of a memory device disclosed herein.

FIG. 9 schematically illustrates an embodiment in which the memory plane PM of the memory device DIS comprises a matrix of memory cells CEL,i,j arranged in rows and in columns, and in which the programming circuitry MPRG comprising a memory cell CELT, are associated with all the rows of the memory plane.

In other words, a control memory cell is provided for the whole of the memory plane, the output of the follower amplifier AMP being connected to all the driver circuits of the row decoder WLDC.

In this case, of course, the third voltage, present on the wordline associated with a row, is delivered on the selection gates of all the cells in the row, whether these cells must remain in an erased state or must be programmed.

The invention claimed is:

1. A method for programming a split-gate memory cell which comprises a state transistor possessing a control gate and a floating gate and a selection transistor possessing a selection gate, the method comprising:
   applying, during a programming duration, a first voltage to the control gate, a second voltage to a drain of the state transistor and a third voltage to the selection gate of the selection transistor; and
   transitioning the third voltage during the programming duration between a first value and a second value greater than the first value.

2. The method according to claim 1, wherein the first value and the second value are situated in a vicinity of a threshold voltage of the selection transistor.

3. The method according to claim 1, wherein the first value and the second value are chosen so that at an end of the programming duration, a threshold voltage of the state transistor of the split-gate memory cell in a programmed state is at a chosen value, allowing a differentiation between this programmed state and an erased state of the split-gate memory cell, when a read voltage is applied to the control gate of the state transistor.

4. The method according to claim 1, wherein transitioning the third voltage transitions comprising ramping the third voltage between the first and the second value.

5. The method according to claim 4, wherein ramping comprises transitioning the third voltage transitions according to a substantially linear ramp.

6. The method according to claim 1, further comprising generating the third voltage by injecting, during the programming duration, a variable programming reference current in a control memory cell and sampling the third voltage on a terminal of the control memory cell.

7. The method according to claim 1, wherein transitioning the third voltage during the programming duration further comprises maintaining the first voltage unchanged during the programming duration.

8. A memory device, comprising:
   a split-gate memory cell comprising:
      a state transistor having a control gate and a floating gate;
      a selection transistor; and
      programming circuitry configured to apply, during a programming duration, a first voltage to the control gate of the state transistor, a second voltage to a drain of the state transistor, and a third voltage to a gate of the selection transistor, and further configured to transition the third voltage during the programming duration between a first value and a second value greater than the first value.

9. The memory device according to claim 8, wherein the first value and the second value are situated in a vicinity of a threshold voltage of the selection transistor.

10. The memory device according to claim 8, wherein the programming circuitry is further configured to apply the first value and the second value so that at an end of said programming duration, a threshold voltage of the state transistor of the split-gate memory cell in a programmed state is at a chosen value, allowing a differentiation between this programmed state and an erased state of the split-gate memory cell when a read voltage is applied to the control gate of the state transistor.

11. The memory device according to claim 8, wherein the programming circuitry is further configured to generate the third voltage so that it transitions substantially along a ramp between the first value and the second value.

12. The memory device according to claim 11, wherein the programming circuitry is further configured to generate the third voltage so that it transitions along a substantially linear ramp.

13. The memory device according to claim 8, wherein the programming circuitry comprises:
   a control memory cell;
   controllable current generation circuitry; and
   control circuitry configured to control the controllable current generation circuitry so as to inject a variable programming reference current into the control memory cell during the programming duration, the third voltage being sampled on a terminal of the control memory cell.

14. The memory device according to claim 13, wherein the control memory cell is structurally identical to the split-gate memory cell, and further comprising control circuitry configured to maintain a state transistor of the control memory cell in a conductive state so as to electrically connect a gate of a selection transistor of the control memory cell to a drain of the state transistor of the control memory cell, an output of the controllable current generation circuitry being connected to the drain, the third voltage being sampled at the drain.

15. The memory device according to claim 8, wherein the selection transistor of the split-gate memory cell is a buried vertical gate transistor, and both the control gate and the floating gate of the state transistor of the split-gate memory cell are horizontal.

16. A memory device, comprising:
   a plurality of split-gate memory cells, each split-gate memory cell comprising:

a state transistor possessing a control gate and a floating gate;

a selection transistor; and programming circuitry configured to apply, during a programming duration, a first voltage to the control gate of the state transistor, a second voltage to a drain of the state transistor, and a third voltage to a gate of the selection transistor, the third voltage transitioning during the programming duration between a first value and a second value greater than the first value;

wherein the plurality of split-gate memory cells are arranged in a memory plane, the memory plane comprising a matrix formed from the plurality of split-gate memory cells arranged in rows and columns, wordlines respectively coupled to the gates of the selection transistors of the split-gate memory cells of a same row, bitlines being coupled to the drains of the state transistors of the split-gate memory cells of a same column, the programming circuitry being configured for delivering the third voltage on the wordline coupled to the selection transistors of the split-gate memory cells having to be programmed.

17. The memory device according to claim 16, wherein the programming circuitry includes one control memory cell per row of split-gate memory cells of the memory plane.

18. The memory device according to claims 17, wherein the memory plane is implemented in an integrated circuit.

\* \* \* \* \*